(12) United States Patent
Pagaila et al.

(10) Patent No.: US 9,824,975 B2
(45) Date of Patent: Nov. 21, 2017

(54) SEMICONDUCTOR DEVICE AND METHOD OF FORMING STEPPED INTERCONNECT LAYER FOR STACKED SEMICONDUCTOR DIE

(71) Applicant: STATS ChipPAC, Ltd., Singapore (SG)

(72) Inventors: Reza A. Pagaila, Tangerang (ID); Byung Tai Do, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 3 days.

(21) Appl. No.: 14/612,075

(22) Filed: Feb. 2, 2015

(65) Prior Publication Data
US 2015/0145128 A1 May 28, 2015

Related U.S. Application Data

(60) Continuation of application No. 13/349,510, filed on Jan. 12, 2012, now Pat. No. 8,946,870, which is a
(Continued)

(51) Int. Cl.
*H01L 23/538* (2006.01)
*H01L 25/07* (2006.01)
(Continued)

(52) U.S. Cl.
CPC ........ *H01L 23/5386* (2013.01); *H01L 21/561* (2013.01); *H01L 21/565* (2013.01); *H01L 21/768* (2013.01); *H01L 23/3121* (2013.01); *H01L 23/3128* (2013.01); *H01L 23/5389* (2013.01); *H01L 24/18* (2013.01); *H01L 24/19* (2013.01); *H01L 24/96* (2013.01); *H01L 24/97* (2013.01); *H01L 25/03* (2013.01); *H01L 25/0657* (2013.01); *H01L 25/074* (2013.01); *H01L 25/50* (2013.01); *H01L 21/568* (2013.01); *H01L 2224/0401* (2013.01); *H01L 2224/04105* (2013.01); *H01L 2224/0557* (2013.01); *H01L 2224/12105* (2013.01); *H01L 2224/16145* (2013.01); *H01L 2224/16225* (2013.01);
(Continued)

(58) Field of Classification Search
CPC .... H01L 23/5386; H01L 25/50; H01L 25/074
See application file for complete search history.

(56) References Cited

U.S. PATENT DOCUMENTS 5,250,843 A 10/1993 Eichelberger
5,353,498 A 10/1994 Fillion et al.
(Continued)

*Primary Examiner* — Seahvosh Nikmanesh
(74) *Attorney, Agent, or Firm* — Robert D. Atkins; Patent Law Group: Atkins and Associates, P.C.

(57) ABSTRACT

A semiconductor device comprises a first semiconductor die. An encapsulant is disposed around the first semiconductor die. A first stepped interconnect structure is disposed over a first surface of the encapsulant. An opening is formed in the first stepped interconnect structure. The opening in the first stepped interconnect structure is over the first semiconductor die. A second semiconductor die is disposed in the opening of the first stepped interconnect structure. A second stepped interconnect structure is disposed over the first stepped interconnect structure. A conductive pillar is formed through the encapsulant.

23 Claims, 19 Drawing Sheets

Related U.S. Application Data division of application No. 12/870,696, filed on Aug. 27, 2010, now Pat. No. 8,097,490.

(51) Int. Cl.
*H01L 21/768* (2006.01)
*H01L 25/00* (2006.01)
*H01L 21/56* (2006.01)
*H01L 23/31* (2006.01)
*H01L 23/00* (2006.01)
*H01L 25/03* (2006.01)
*H01L 25/065* (2006.01)

(52) U.S. Cl.
CPC *H01L 2224/20* (2013.01); *H01L 2224/32145* (2013.01); *H01L 2224/73253* (2013.01); *H01L 2224/73259* (2013.01); *H01L 2224/97* (2013.01); *H01L 2225/06517* (2013.01); *H01L 2225/06548* (2013.01); *H01L 2225/06572* (2013.01); *H01L 2924/00014* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01029* (2013.01); *H01L 2924/01032* (2013.01); *H01L 2924/01047* (2013.01); *H01L 2924/01049* (2013.01); *H01L 2924/01073* (2013.01); *H01L 2924/01074* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/15311* (2013.01); *H01L 2924/181* (2013.01)

(56) References Cited

U.S. PATENT DOCUMENTS

| | | | |
|---|---|---|---|
| 5,841,193 | A | 11/1998 | Eichelberger |
| 7,339,278 | B2 | 3/2008 | Iksan et al. |
| 7,619,901 | B2 | 11/2009 | Eichelberger et al. |
| 7,799,602 | B2 | 9/2010 | Pagaila et al. |
| 7,863,735 | B1 | 1/2011 | Cho et al. |
| 7,884,484 | B2 | 2/2011 | Yamano et al. |
| 7,955,942 | B2 | 6/2011 | Pagaila et al. |
| 8,558,392 | B2 * | 10/2013 | Chua .............. H01L 21/561 257/676 |
| 2010/0025833 | A1 | 2/2010 | Pagaila et al. |
| 2011/0278741 | A1 | 11/2011 | Chua et al. |

* cited by examiner

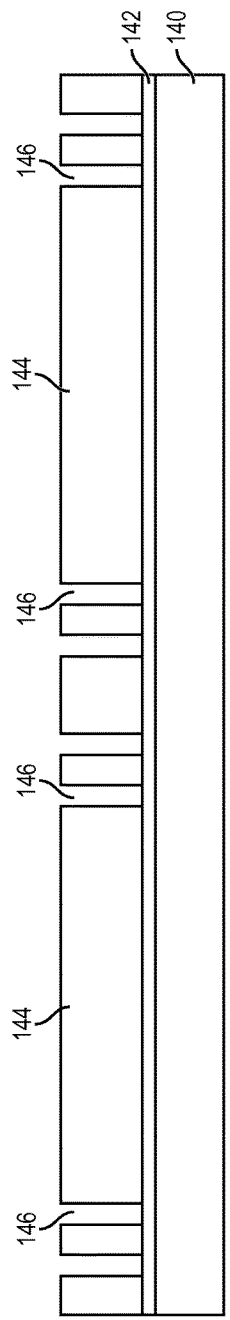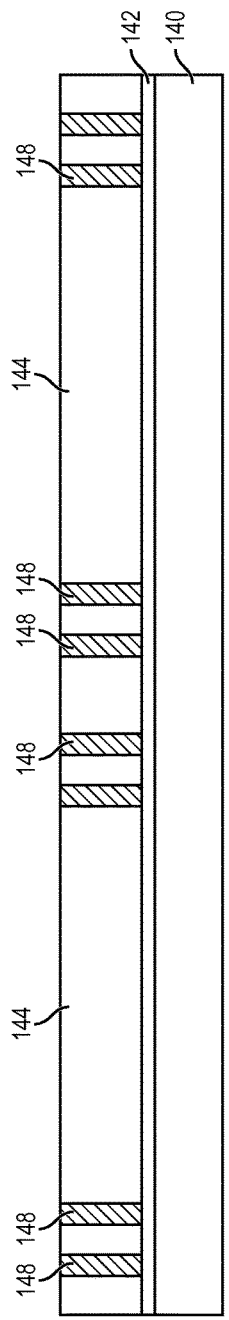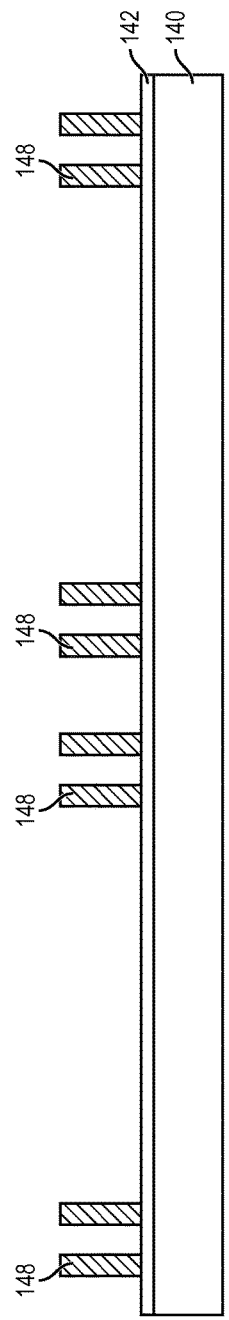

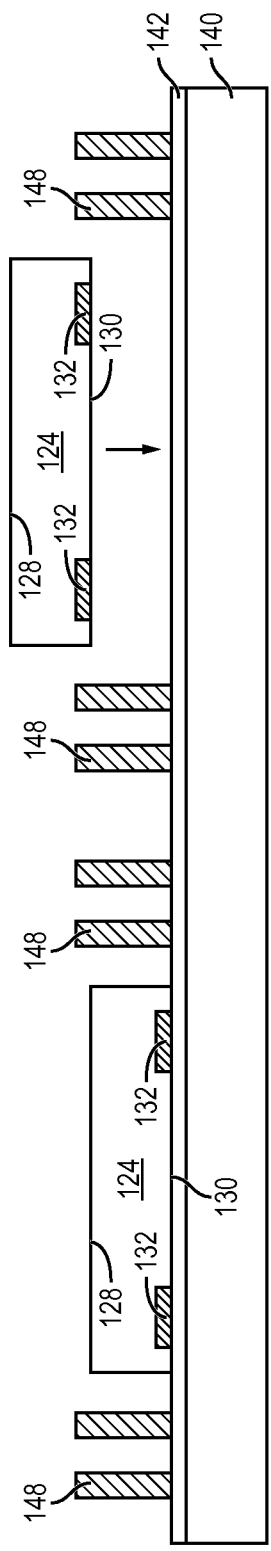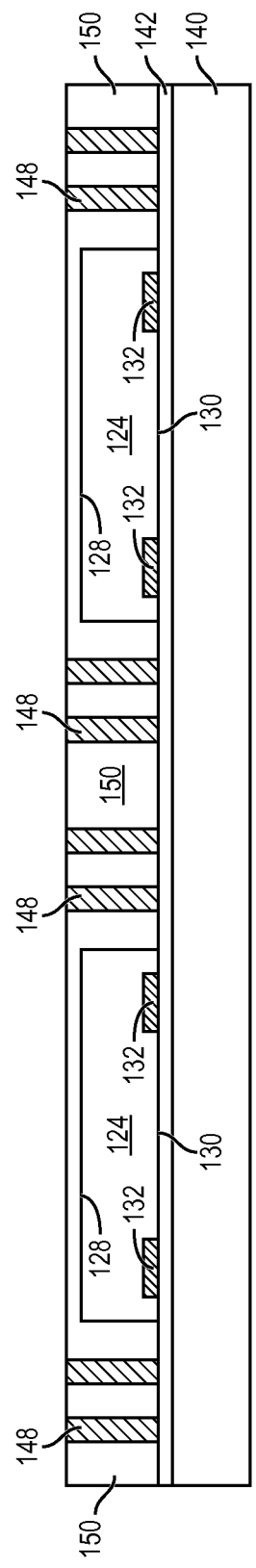

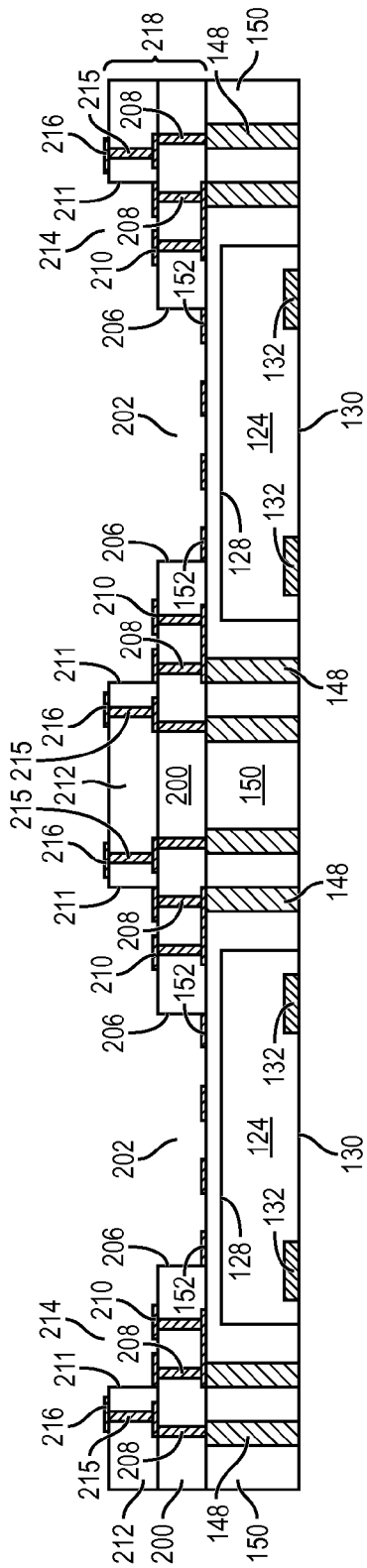
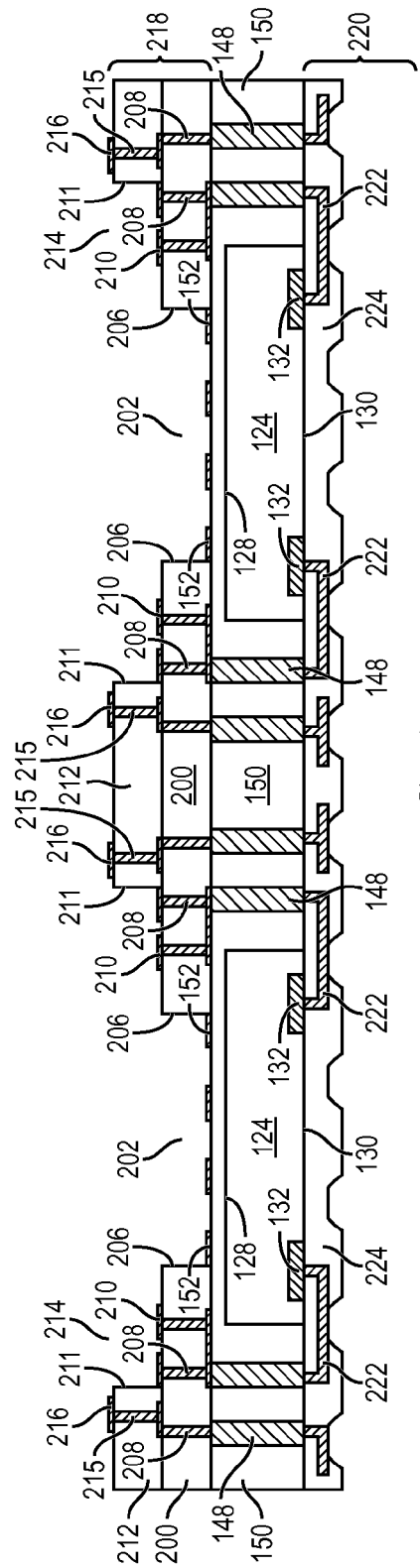
FIG. 6f
FIG. 6g

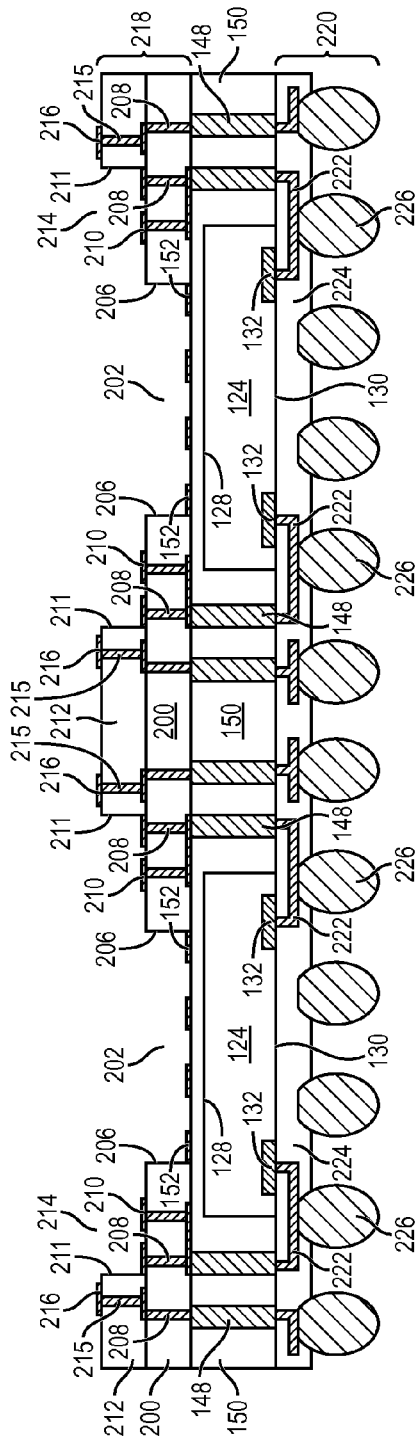
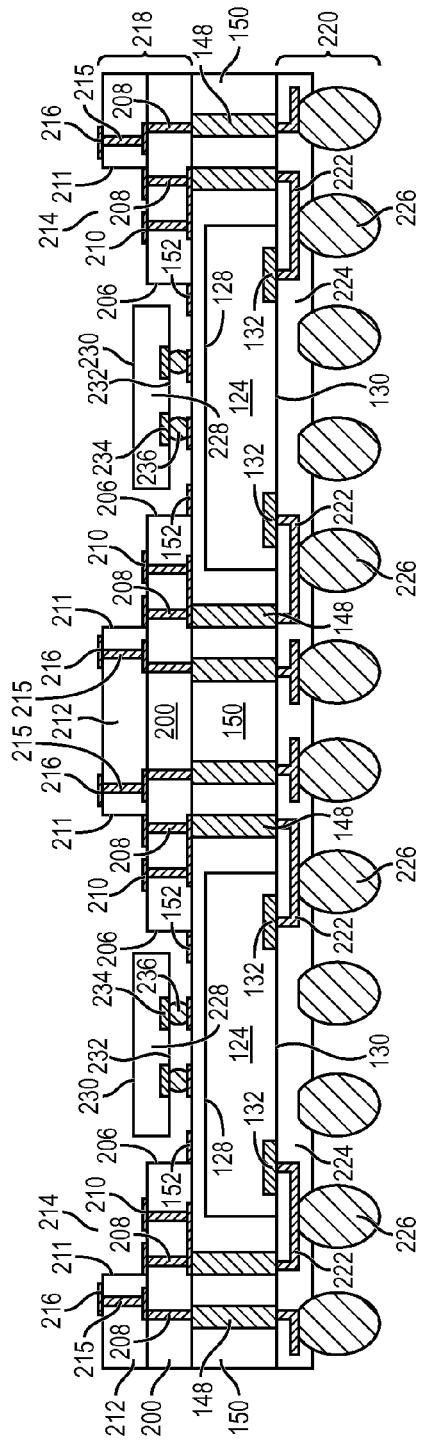
FIG. 6h
FIG. 6i ance Ser. No. 13/349,510, now U.S. Pat. No. 8,946,870, filed Jan. 12, 2012, which is a division of U.S. patent application Ser. No. 12/870,696, now U.S. Pat. No. 8,097,490, filed Aug. 27, 2010, which applications are incorporated herein by reference.

SEMICONDUCTOR DEVICE AND METHOD OF FORMING STEPPED INTERCONNECT LAYER FOR STACKED SEMICONDUCTOR DIE

CLAIM TO DOMESTIC PRIORITY

The present application is a continuation of U.S. patent application Ser. No. 13/349,510, now U.S. Pat. No. 8,946,870, filed Jan. 12, 2012, which is a division of U.S. patent application Ser. No. 12/870,696, now U.S. Pat. No. 8,097,490, filed Aug. 27, 2010, which applications are incorporated herein by reference.

FIELD OF THE INVENTION

The present invention relates in general to semiconductor devices and, more particularly, to a semiconductor device and method of forming a stepped interconnect layer for electrically connecting stacked semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (Fo-WLCSP), a first semiconductor die is typically enclosed by an encapsulant. A top and bottom build-up interconnect structure are formed over opposite surfaces of the encapsulant. A second semiconductor die can be stacked over the Fo-WLCSP and electrically connected to the top build-up interconnect structure with bumps. A third semiconductor die can be stacked over the second semiconductor die and electrically connected to the top build-up interconnect structure with bumps. Due to the thickness of the second semiconductor die, the bumps of the third semiconductor die are necessarily large to span the gap between the third semiconductor die and top build-up interconnect structure. The large bumps restrict the interconnect pitch for the third semiconductor die and reduce the input/output (I/O) count. In addition, large bumps are susceptible to collapse which can cause electrical short and device defects.

SUMMARY OF THE INVENTION

A need exists for a Fo-WLCSP with semiconductor die stacked over the Fo-WLCSP with small bumps and fine interconnect pitch. Accordingly, in one embodiment, the present invention is a method of making a semiconductor device comprising the steps of providing a first semiconductor die, depositing an encapsulant around the first semiconductor die, and forming a first stepped interconnect structure over a surface of the encapsulant.

In another embodiment, the present invention is a method of making a semiconductor device comprising the steps of providing a first semiconductor die and forming a first stepped interconnect structure over the first semiconductor die.

In another embodiment, the present invention is a semiconductor device comprising a first semiconductor die. An encapsulant is disposed around the first semiconductor die. A first stepped interconnect structure is disposed over a first surface of the encapsulant.

In another embodiment, the present invention is a semiconductor device comprising a first semiconductor die and a first stepped interconnect structure disposed over the first semiconductor die.

BRIEF DESCRIPTION OF THE DRAWINGS

FIGS. 6a-6k illustrate a process of forming multiple stepped interconnect layers for electrically connecting stacked semiconductor die;

DETAILED DESCRIPTION OF THE DRAWINGS

Figure 1:
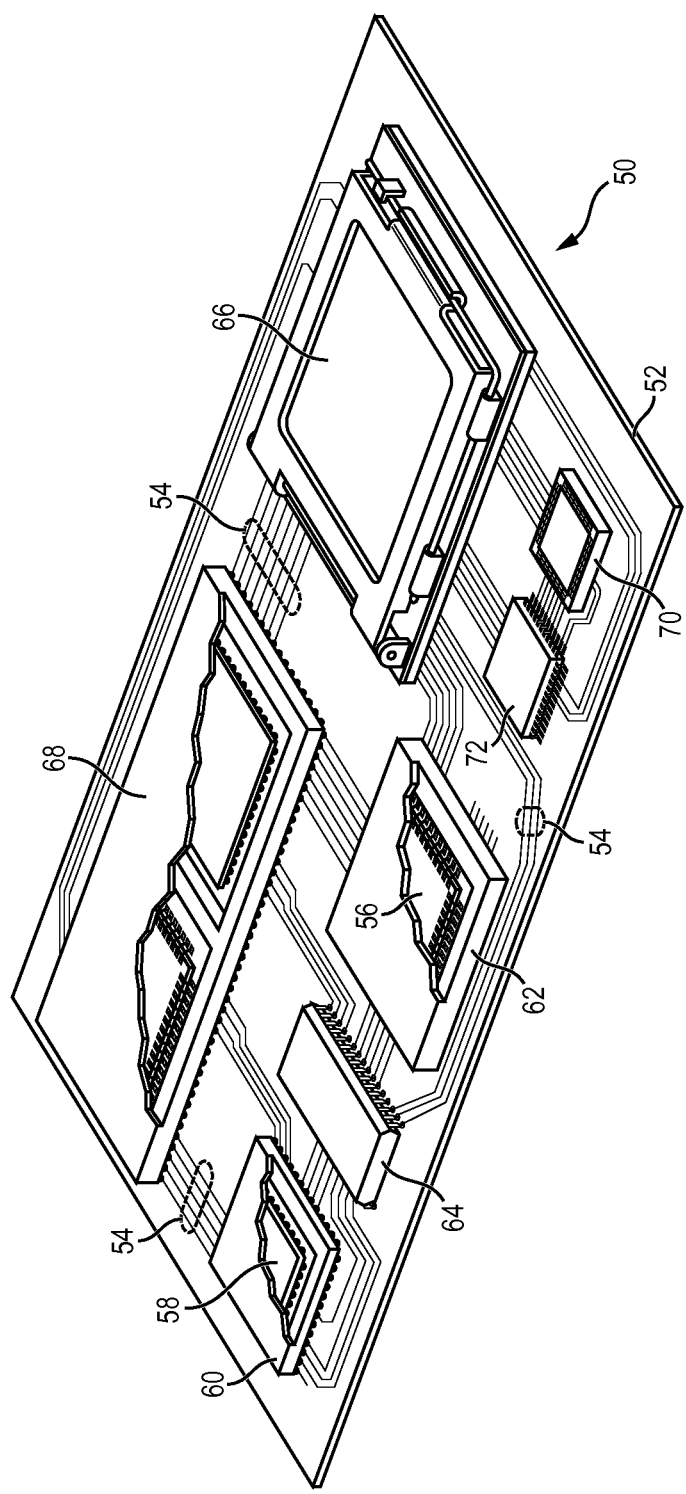
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
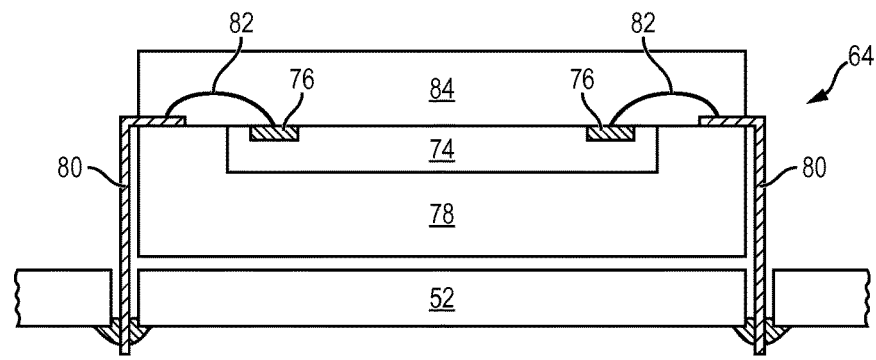
FIGS. 2a-2c illustrate further detail of the semiconductor packages mounted to the PCB.
Figure 2B:
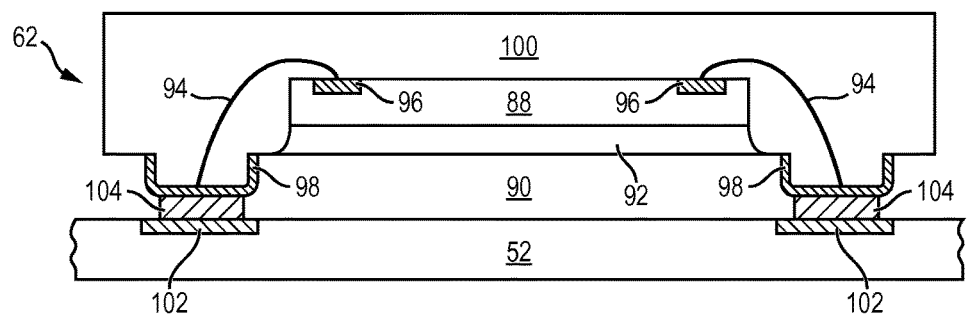
Figure 2C:
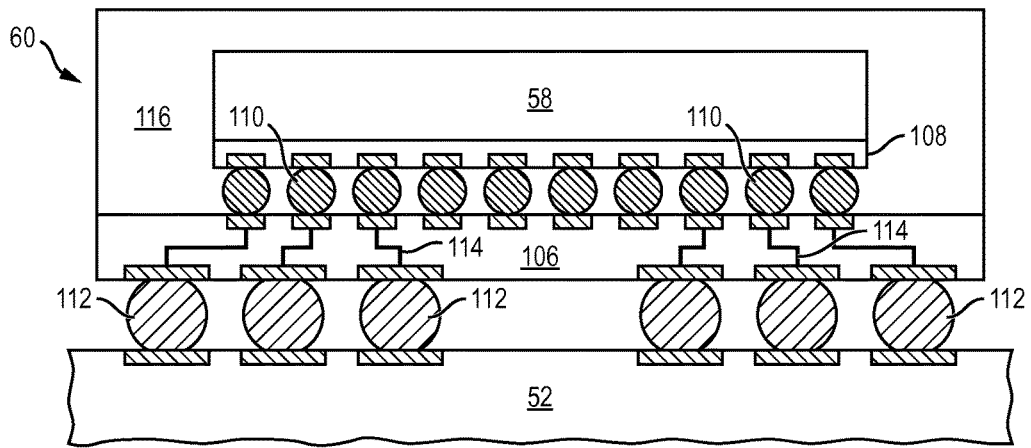

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
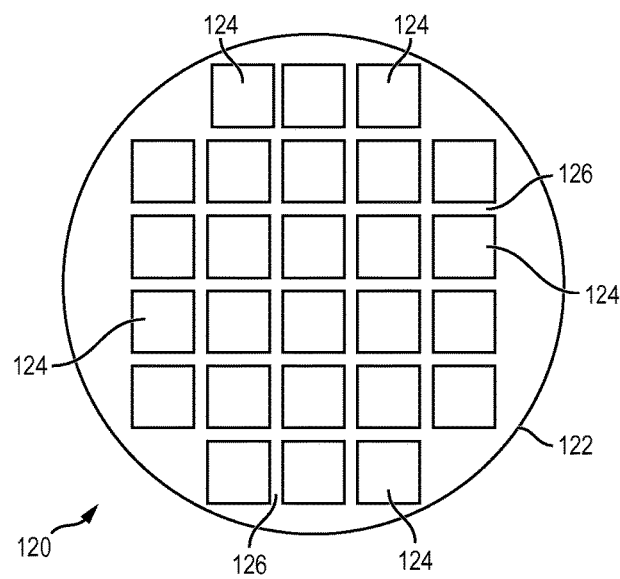
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
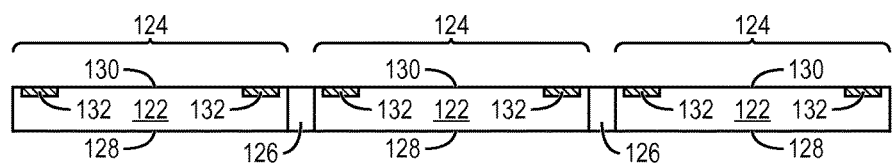

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
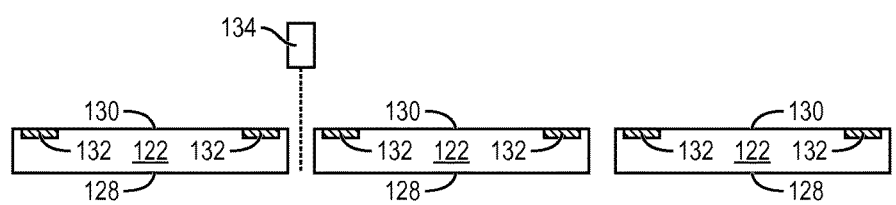

In FIG. 3c, semiconductor wafer 120 is singulated through saw street 126 using a saw blade or laser cutting tool 134 into individual semiconductor die 124.

Figure 4F:
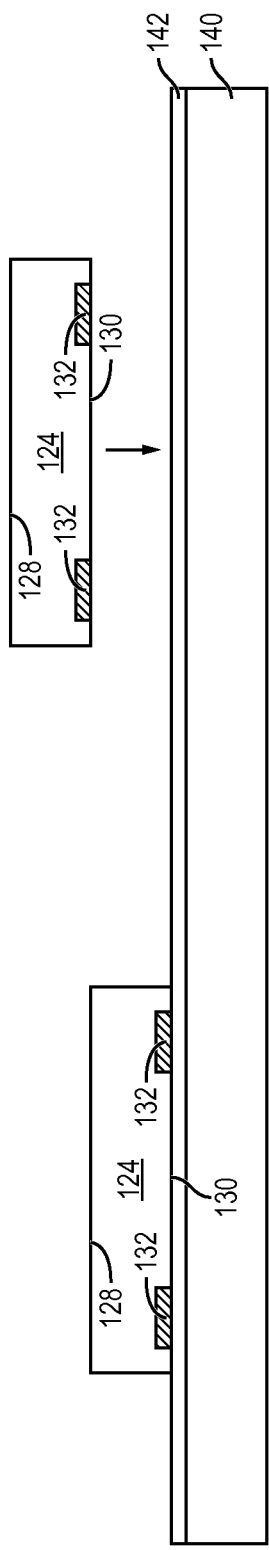
FIGS. 4a-4p illustrate a process of forming a stepped interconnect layer for electrically connecting stacked semiconductor die.
Figure 4G:
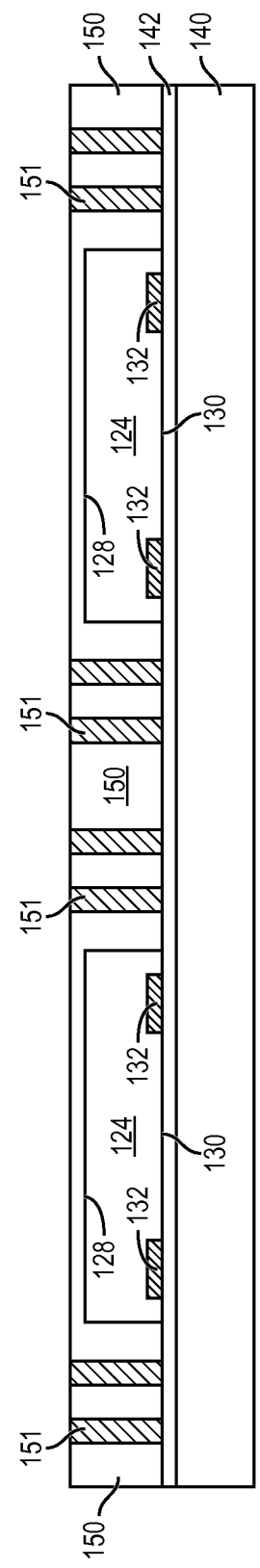
Figure 4H:
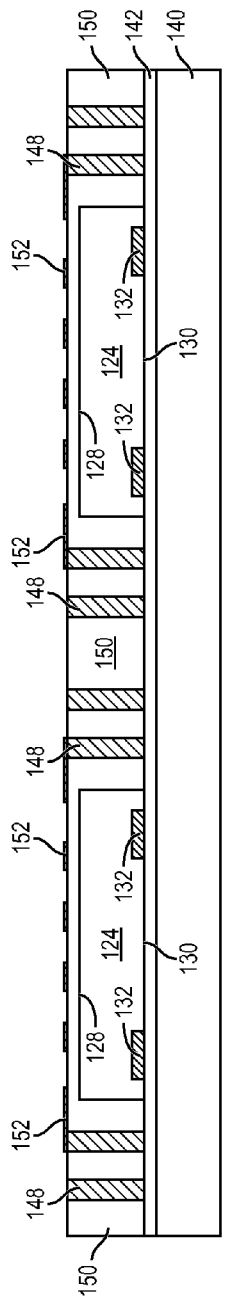
Figure 4I:
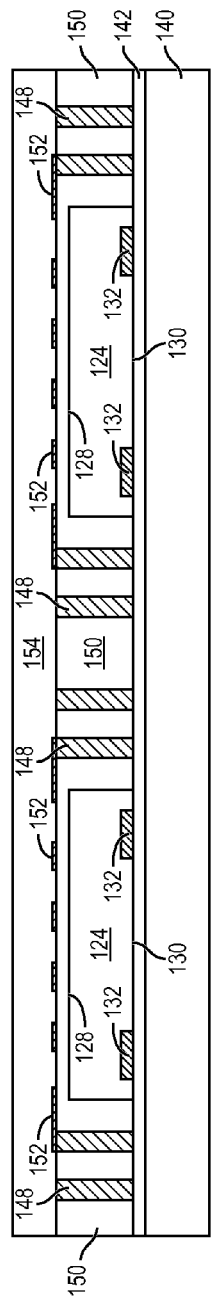
Figure 4J:
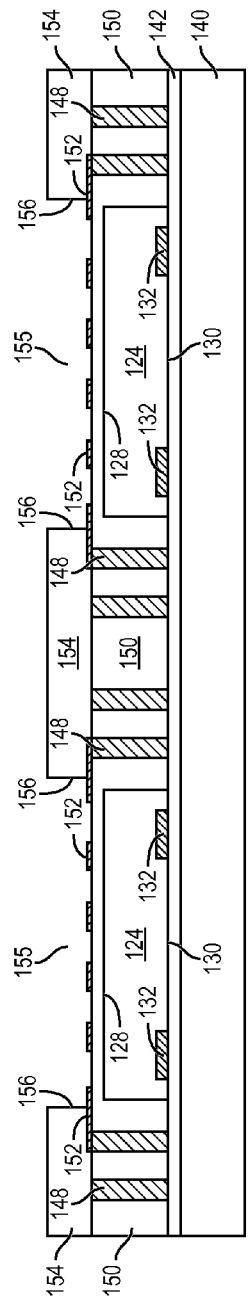
Figure 4K:
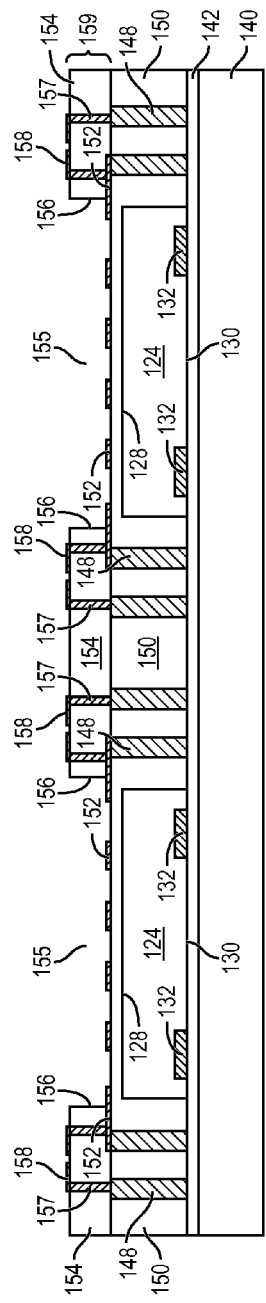
Figure 4L:
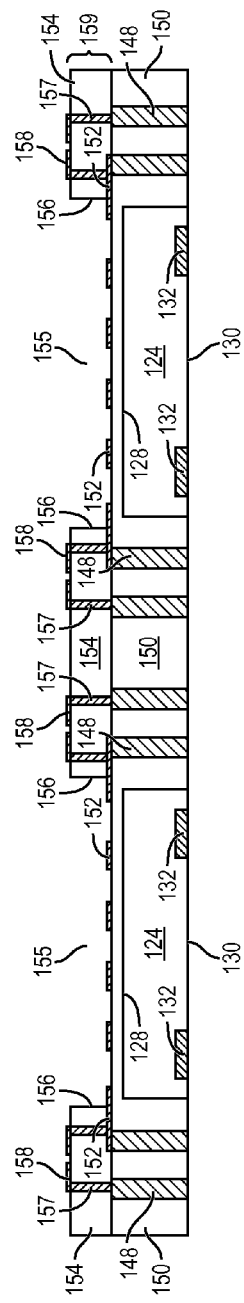
Figure 4M:
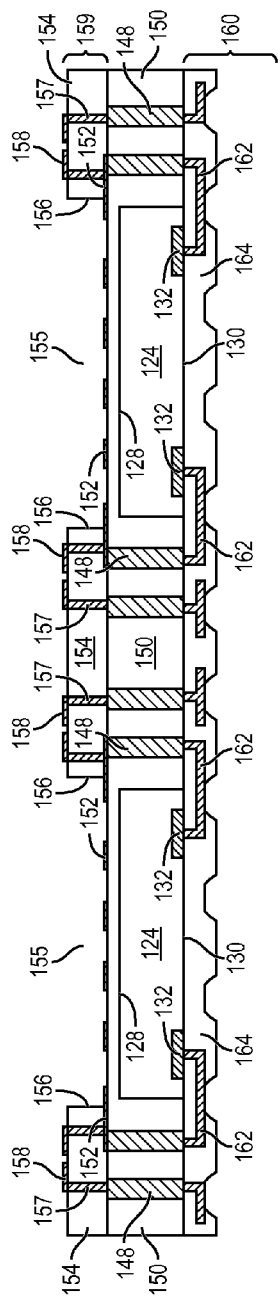
Figure 4N:
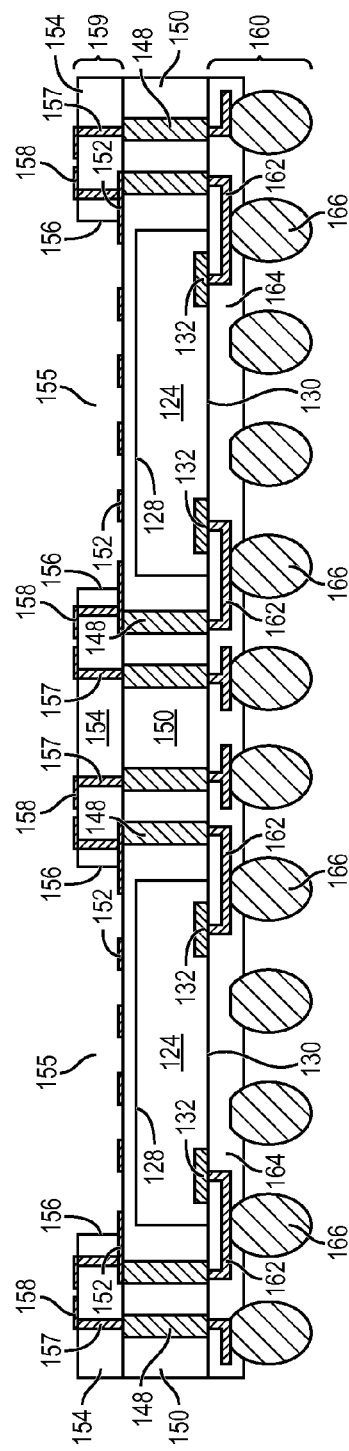
Figure 4O:
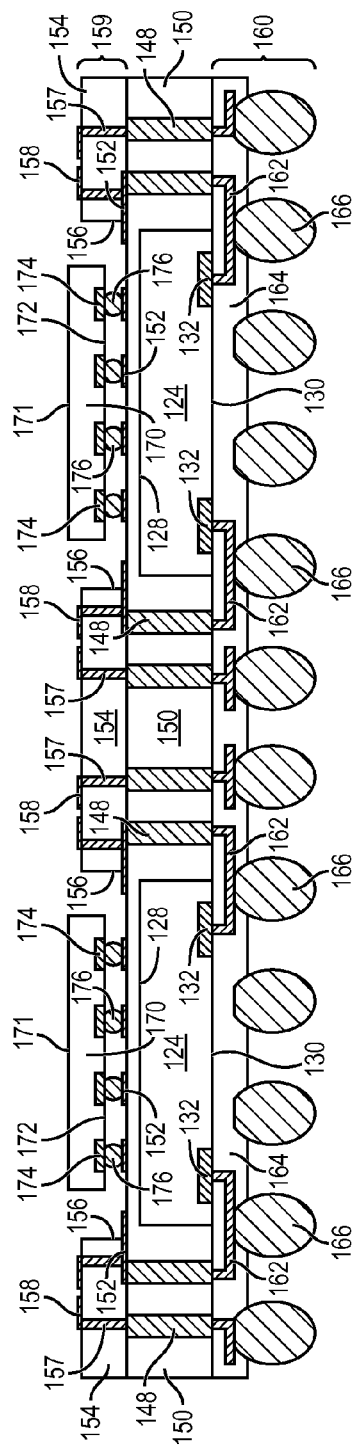
Figure 4P:
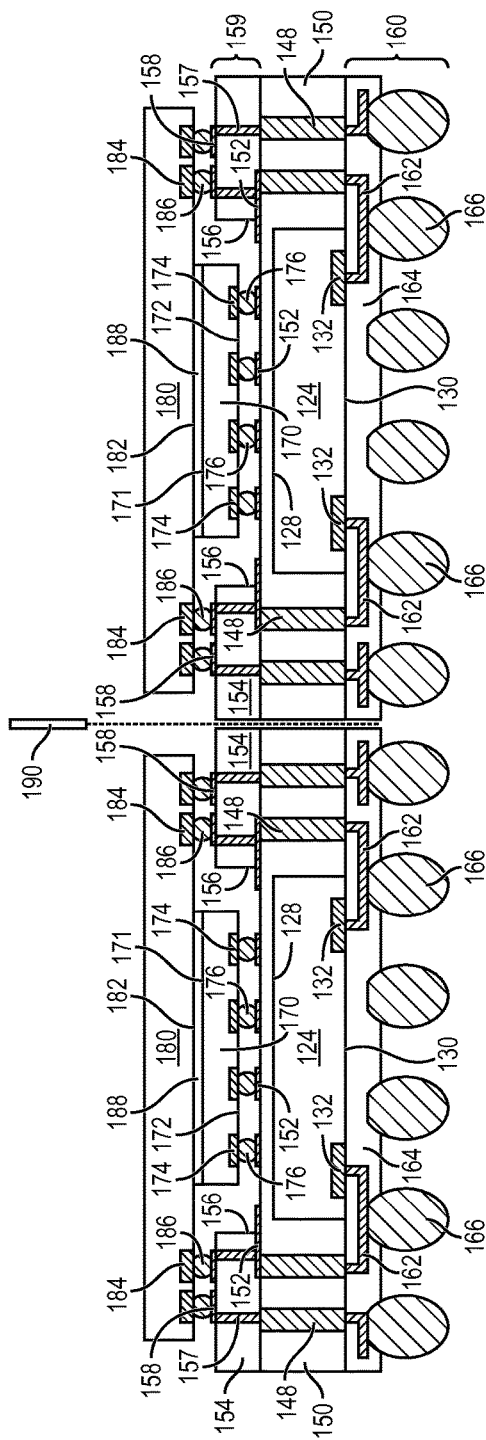

FIGS. 4a-4p illustrate, in relation to FIGS. 1 and 2a-2c, a process of forming a stepped interconnect layer for electrically connecting stacked semiconductor die. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

A photoresist layer 144 is deposited over interface layer 142 and carrier 140. A plurality of vias 146 is formed through photoresist layer 144 down to interface layer 142 using a patterning and etching process. In FIG. 4b, vias 146 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive pillars 148. In FIG. 4c, photoresist layer 144 is removed leaving conductive pillars 148 over carrier 140.

In FIG. 4d, semiconductor die 124 from FIG. 3a-3c are mounted over interface layer 142 between conductive pillars 148 with active surface 130 oriented toward carrier 140. Conductive pillars 148 have a height greater than a thickness of semiconductor die 124.

In FIG. 4e, an encapsulant or molding compound 150 is deposited over carrier 140 and semiconductor die 124 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants. Semiconductor die 124 can be mounted to wettable contact pads formed over carrier 140 to reduce die shifting during encapsulation.

In an alternate process, semiconductor die 124 from FIG. 3a-3c are mounted over interface layer 142 with active surface 130 oriented toward carrier 140 prior to forming the conductive pillars, as shown in FIG. 4f.

In FIG. 4g, an encapsulant or molding compound 150 is deposited over carrier 140 and semiconductor die 124 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants. Semiconductor die 124 can be mounted to wettable contact pads formed over carrier 140 to reduce die shifting during encapsulation.

A plurality of vias is formed through encapsulant 150 using laser drilling, mechanical drilling, or deep reactive ion etching (DRIE). The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive through mold vias (TMV) 151. Conductive TMV 151 have a height greater than a thickness of semiconductor die 124.

Continuing from FIG. 4e or 4g, an electrically conductive layer or redistribution layer (RDL) 152 is formed over encapsulant 150 above semiconductor die 124 using a patterning and metal deposition process such as printing, PVD, CVD, sputtering, electrolytic plating, and electroless plating, as shown in FIG. 4h. Conductive layer 152 can be one or more layers of Al, Cu, Sn, Ni, Au, Ag, or other suitable electrically conductive material. One portion of conductive layer 152 is electrically connected to conductive pillars 148. Other portions of conductive layer 152 can be electrically common or electrically isolated depending on the design and function of semiconductor die 124.

In FIG. 4i, an insulating or passivation layer 154 is formed over encapsulant 150 and conductive layer 152 using PVD, CVD, screen printing, spin coating, spray coating, sintering or thermal oxidation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. In one embodiment, insulating layer 154 is 100-200 micrometers (μm) in thickness, depending on the thickness of a subsequently mounted semiconductor die.

In FIG. 4j, a portion of insulating layer 154 is removed by an etching process to form opening or recess 155 over a central area with respect to semiconductor die 124 and expose conductive layer 152 over the semiconductor die. The opening 155 has vertical sidewalls 156 for a stepped profile.

In FIG. 4k, a plurality of vias is formed through insulating layer 154 over conductive pillars 148 and/or conductive layer 152 using laser drilling, mechanical drilling, or etching process. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 157. Conductive vias 157 are electrically connected to conductive pillars 148 and conductive layer 152.

An electrically conductive layer or RDL 158 is formed over insulating layer 154 and conductive vias 157 using a patterning and metal deposition process such as printing, PVD, CVD, sputtering, electrolytic plating, and electroless plating. Conductive layer 158 can be one or more layers of Al, Cu, Sn, Ni, Au, Ag, or other suitable electrically conductive material. One portion of conductive layer 158 is electrically connected to conductive vias 157. Other portions of conductive layer 158 can be electrically common or electrically isolated depending on the design and function of semiconductor die 124. The insulating layer 154 with opening 155 and vertical sidewalls 156, as well as conductive vias 157 and conductive layer 158, constitute a first stepped interconnect structure or layer 159.

In FIG. 4*l*, carrier 140 and interface layer 142 are removed by chemical etching, mechanical peeling, CMP, mechanical grinding, thermal bake, UV light, laser scanning, or wet stripping to expose semiconductor die 124, conductive pillars 148, and encapsulant 150.

In FIG. 4*m*, a build-up interconnect structure 160 is formed over semiconductor die 124, conductive pillars 148, and encapsulant 150. The build-up interconnect structure 160 includes an electrically conductive layer or RDL 162 formed using a patterning and metal deposition process such as sputtering, electrolytic plating, and electroless plating. Conductive layer 162 can be one or more layers of Al, Cu, Sn, Ni, Au, Ag, or other suitable electrically conductive material. One portion of conductive layer 162 is electrically connected to contact pads 132 of semiconductor die 124. Another portion of conductive layer 162 is electrically connected to conductive pillars 148. Other portions of conductive layer 162 can be electrically common or electrically isolated depending on the design and function of semiconductor die 124.

An insulating or passivation layer 164 is formed around conductive layer 162 for electrical isolation using PVD, CVD, printing, spin coating, spray coating, sintering or thermal oxidation. The insulating layer 164 contains one or more layers of SiO2, Si3N4, SiON, Ta2O5, Al2O3, or other material having similar insulating and structural properties. A portion of insulating layer 164 can be removed by an etching process to expose conductive layer 162 for additional electrical interconnect.

In FIG. 4*n*, an electrically conductive bump material is deposited over build-up interconnect structure 160 and electrically connected to the exposed portion of conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form spherical balls or bumps 166. In some applications, bumps 166 are reflowed a second time to improve electrical contact to conductive layer 162. An under bump metallization (UBM) can be formed under bumps 166. The bumps can also be compression bonded to conductive layer 162. Bumps 166 represent one type of interconnect structure that can be formed over conductive layer 162. The interconnect structure can also use stud bump, micro bump, or other electrical interconnect.

In FIG. 4*o*, semiconductor die 170 has a back surface 171 and an active surface 172 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 172 to implement analog circuits or digital circuits, such as DSP, ASIC, memory, or other signal processing circuit. Semiconductor die 170 may also contain IPDs, such as inductors, capacitors, and resistors, for RF signal processing. In one embodiment, semiconductor die 170 is a flipchip type semiconductor die. Contact pads 174 are formed over active surface 172 and electrically connected to the circuits on the active surface. Bumps 176 are formed over contact pads 174. Semiconductor die 170 is mounted within opening 155 of insulating layer 154 to conductive layer 152 using bump 176. Accordingly, semiconductor die 170 are at least partially contained within opening 155.

In FIG. 4*p*, semiconductor die 180 has an active surface 182 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 182 to implement analog circuits or digital circuits, such as DSP, ASIC, memory, or other signal processing circuit. Semiconductor die 180 may also contain IPDs, such as inductors, capacitors, and resistors, for RF signal processing. In one embodiment, semiconductor die 180 is a flipchip type semiconductor die. Contact pads 184 are formed over active surface 182 and electrically connected to the circuits on the active surface. Bumps 186 are formed over contact pads 174. Semiconductor die 180 is mounted to back surface 171 of semiconductor die 170 using a b-stage backside coating 188. Bumps 186 are electrically connected to conductive layer 158 of stepped interconnect layer 159.

Semiconductor die 124, 170, and 180 are singulated through stepped interconnect layer 159, encapsulant 150, and build-up interconnect structure 160 with saw blade or laser cutting tool 190 into individual Fo-WLCSP 192. In another embodiment, the singulation of stepped interconnect layer 159, encapsulant 150, and build-up interconnect structure 160 occurs prior to mounting semiconductor die 170 and 180, i.e., after FIG. 4*n*. Semiconductor die 170 and 180 are mounted after singulation.

Figure 5:
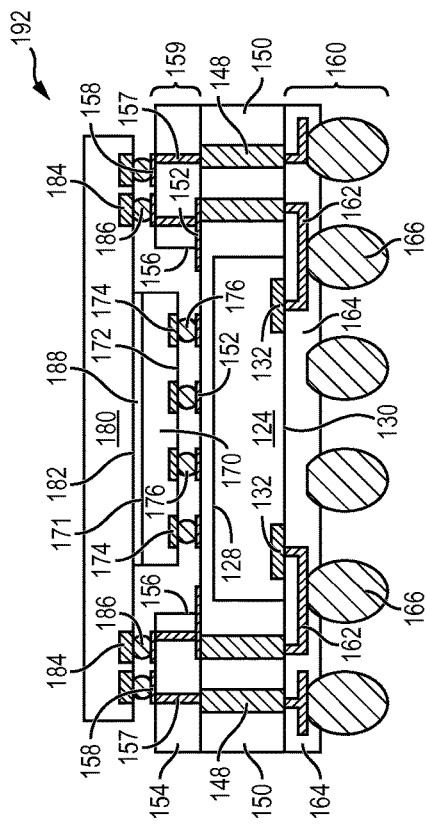
FIG. 5 illustrates a Fo-WLCSP with the stepped interconnect layer electrically connecting the stacked semiconductor die.

FIG. 5 shows Fo-WLCSP 192 after singulation. Semiconductor die 124 is electrically connected through contact pads 132 and build-up interconnect structure 160 to conductive pillars 148, conductive layer 152, and stepped interconnect layer 159. Semiconductor die 170 is partially disposed within opening 155 of stepped interconnect layer 159 to reduce the thickness of Fo-WLCSP 192. Semiconductor die 170 is electrically connected to conductive layer 152, conductive pillars 148, stepped interconnect layer 159, and build-up interconnect structure 160. Semiconductor die 180 is mounted over semiconductor die 170 and electrically connected to stepped interconnect layer 159, conductive layer 152, conductive pillars 148, and build-up interconnect structure 160. With semiconductor die 170 at least partially disposed within opening 155, bumps 176 and 186 can be made small for a fine interconnect pitch. The small size and fine pitch of bumps 176 and 186 increase I/O count and reduces bump collapse. Additional stepped layers can be formed in build-up interconnect structure 159, as described in FIGS. 6*a*-6*k*, to accommodate more stacked semiconductor die.

Figure 6A:
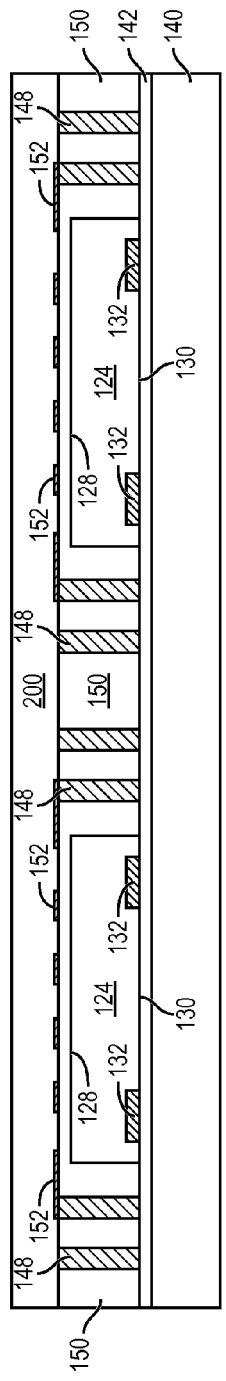

FIGS. 6*a*-6*k* show a process of forming multiple stepped interconnect layers for electrically connecting stacked semiconductor die. Continuing from FIG. 4*h*, an insulating or passivation layer 200 is formed over encapsulant 150 and conductive layer 152 using PVD, CVD, screen printing, spin coating, spray coating, sintering or thermal oxidation, as shown in FIG. 6*a*. The insulating layer 200 contains one or more layers of SiO2, Si3N4, SiON, Ta2O5, Al2O3, or other material having similar insulating and structural properties. In one embodiment, insulating layer 200 is 100-200 μm in thickness, depending on the thickness of a subsequently mounted semiconductor die.

Figure 6B:
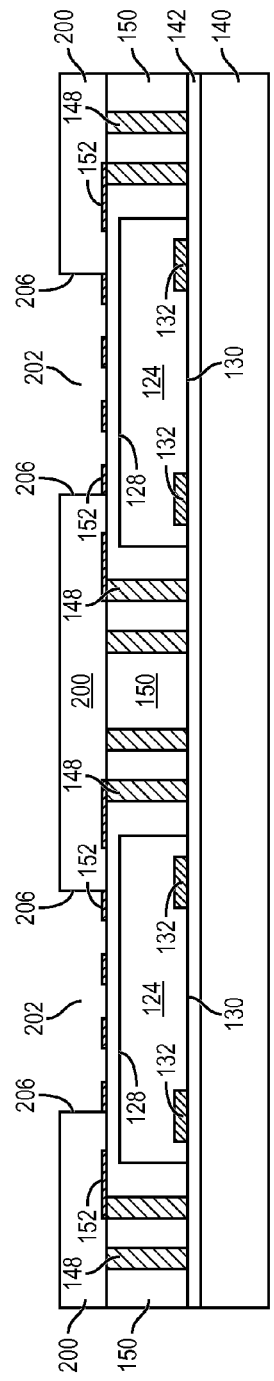

In FIG. 6*b*, a portion of insulating layer 200 is removed by an etching process to form opening or recess 202 over a central area with respect to semiconductor die 124 and expose conductive layer 152 over the semiconductor die. The opening 202 has vertical sidewalls 206 for a stepped profile.

Figure 6C:
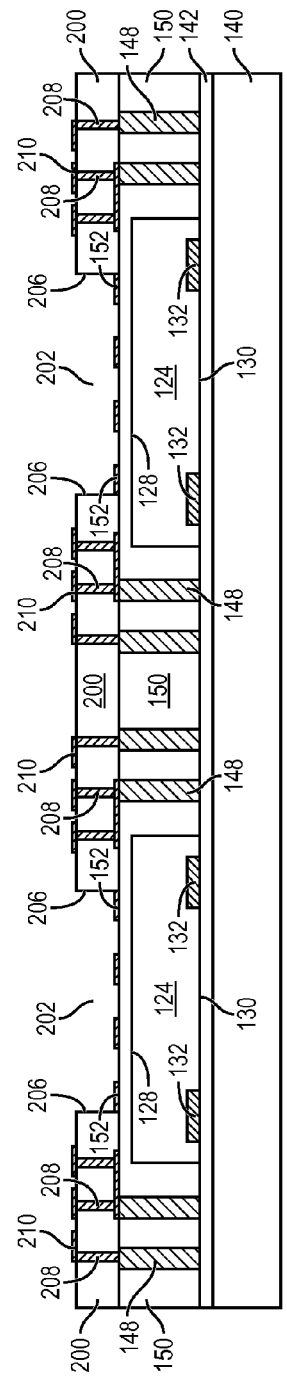

In FIG. 6c, a plurality of vias is formed through insulating layer 200 over conductive pillars 148 using laser drilling, mechanical drilling, or etching process. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 208. Conductive vias 208 are electrically connected to conductive pillars 148 and/or conductive layer 152.

An electrically conductive layer or RDL 210 is formed over insulating layer 200 and conductive vias 208 using a patterning and metal deposition process such as printing, PVD, CVD, sputtering, electrolytic plating, and electroless plating. Conductive layer 210 can be one or more layers of Al, Cu, Sn, Ni, Au, Ag, or other suitable electrically conductive material. One portion of conductive layer 210 is electrically connected to conductive vias 208. Other portions of conductive layer 210 can be electrically common or electrically isolated depending on the design and function of semiconductor die 124. The insulating layer 200 with opening 202, as well as conductive vias 208 and conductive layer 210, constitute a first stepped interconnect structure or layer.

Figure 6D:
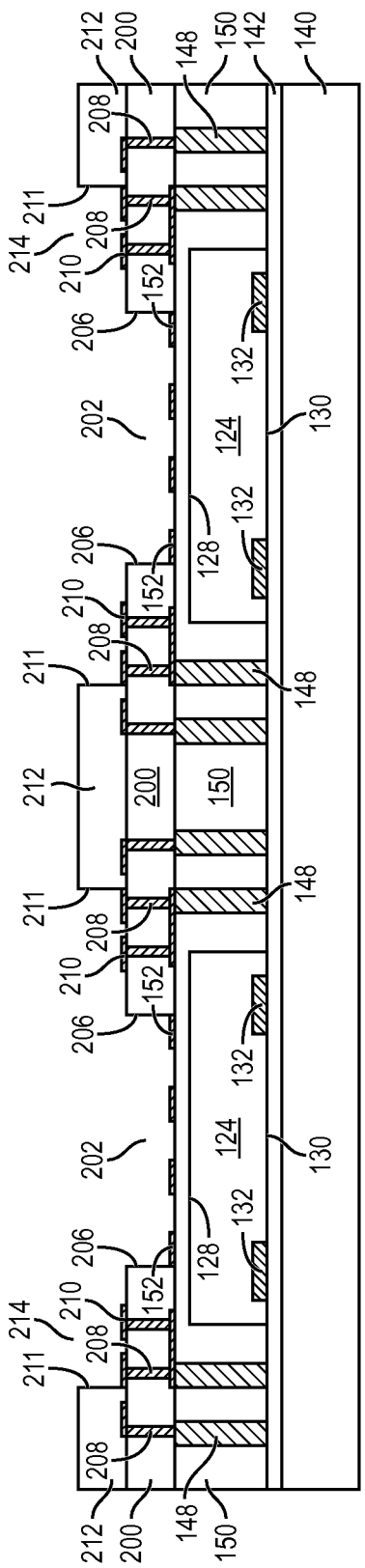

In FIG. 6d, an insulating or passivation layer 212 is selectively formed over a portion of insulating layer 200 and conductive layer 210 to form opening or recess 214. The opening 214 has vertical sidewalls 211 for a stepped profile. The insulating layer 212 contains one or more layers of SiO2, Si3N4, SiON, Ta2O5, Al2O3, or other material having similar insulating and structural properties. In one embodiment, insulating layer 212 is 100-200 µm in thickness, depending on the thickness of a subsequently mounted semiconductor die.

Figure 6E:
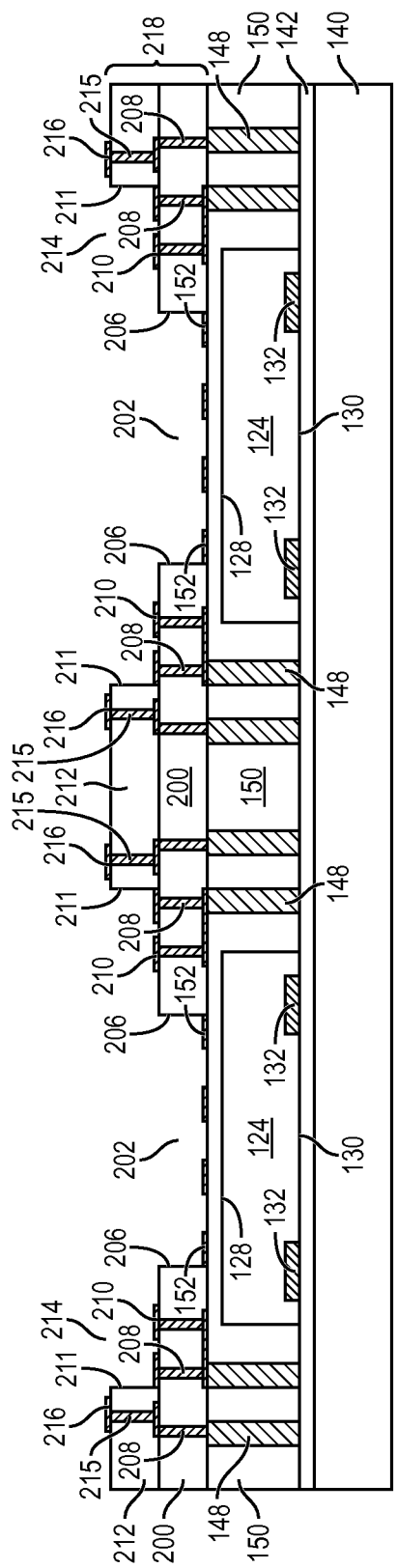

In FIG. 6e, a plurality of vias is formed through insulating layer 212 over conductive layer 210 using laser drilling, mechanical drilling, or etching process. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 215. Conductive vias 215 are electrically connected to conductive layer 210.

An electrically conductive layer or RDL 216 is formed over insulating layer 212 and conductive vias 215 using a patterning and metal deposition process such as printing, PVD, CVD, sputtering, electrolytic plating, and electroless plating. Conductive layer 216 can be one or more layers of Al, Cu, Sn, Ni, Au, Ag, or other suitable electrically conductive material. One portion of conductive layer 216 is electrically connected to conductive vias 215. Other portions of conductive layer 216 can be electrically common or electrically isolated depending on the design and function of semiconductor die 124. The insulating layer 200 with opening 202 and insulating layer 212 with opening 214, as well as conductive vias 208 and 215 and conductive layers 210 and 216, constitute first and second stepped interconnect layers 218.

In FIG. 6f, carrier 140 and interface layer 142 are removed by chemical etching, mechanical peeling, CMP, mechanical grinding, thermal bake, UV light, laser scanning, or wet stripping to expose semiconductor die 124, conductive pillars 148, and encapsulant 150.

In FIG. 6g, a build-up interconnect structure 220 is formed over semiconductor die 124, conductive pillars 148, and encapsulant 150. The build-up interconnect structure 220 includes an electrically conductive layer or RDL 222 formed using a patterning and metal deposition process such as sputtering, electrolytic plating, and electroless plating. Conductive layer 222 can be one or more layers of Al, Cu, Sn, Ni, Au, Ag, or other suitable electrically conductive material. One portion of conductive layer 222 is electrically connected to contact pads 132 of semiconductor die 124. Another portion of conductive layer 222 is electrically connected to conductive pillars 148. Other portions of conductive layer 222 can be electrically common or electrically isolated depending on the design and function of semiconductor die 124.

An insulating or passivation layer 224 is formed around conductive layer 222 for electrical isolation using PVD, CVD, printing, spin coating, spray; coating, sintering or thermal oxidation. The insulating layer 224 contains one or more layers of SiO2, Si3N4, SiON, Ta2O5, Al2O3, or other material having similar insulating and structural properties. A portion of insulating layer 224 can be removed by an etching process to expose conductive layer 222 for additional electrical interconnect.

In FIG. 6h, an electrically conductive bump material is deposited over build-up interconnect structure 220 and electrically connected to the exposed portion of conductive layer 222 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 222 using a suitable attachment or bonding process. In one embodiment, the bump material is reflowed by heating the material above its melting point to form spherical balls or bumps 226. In some applications, bumps 226 are reflowed a second time to improve electrical contact to conductive layer 222. A UBM can be formed under bumps 226. The bumps can also be compression bonded to conductive layer 222. Bumps 226 represent one type of interconnect structure that can be formed over conductive layer 222. The interconnect structure can also use stud bump, micro bump, or other electrical interconnect.

In FIG. 6i, semiconductor die 228 has a back surface 230 and an active surface 232 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 232 to implement analog circuits or digital circuits, such as DSP, ASIC, memory, or other signal processing circuit. Semiconductor die 228 may also contain IPDs, such as inductors, capacitors, and resistors, for RF signal processing. In one embodiment, semiconductor die 228 is a flipchip type semiconductor die. Contact pads 234 are formed over active surface 232 and electrically connected to the circuits on the active surface. Bumps 236 are formed over contact pads 234. Semiconductor die 228 is mounted within opening 202 of insulating layer 200 to conductive layer 152 using bump 236. Accordingly, semiconductor die 228 are at least partially contained within opening 202 of the first stepped interconnect layer 218.

Figure 6J:
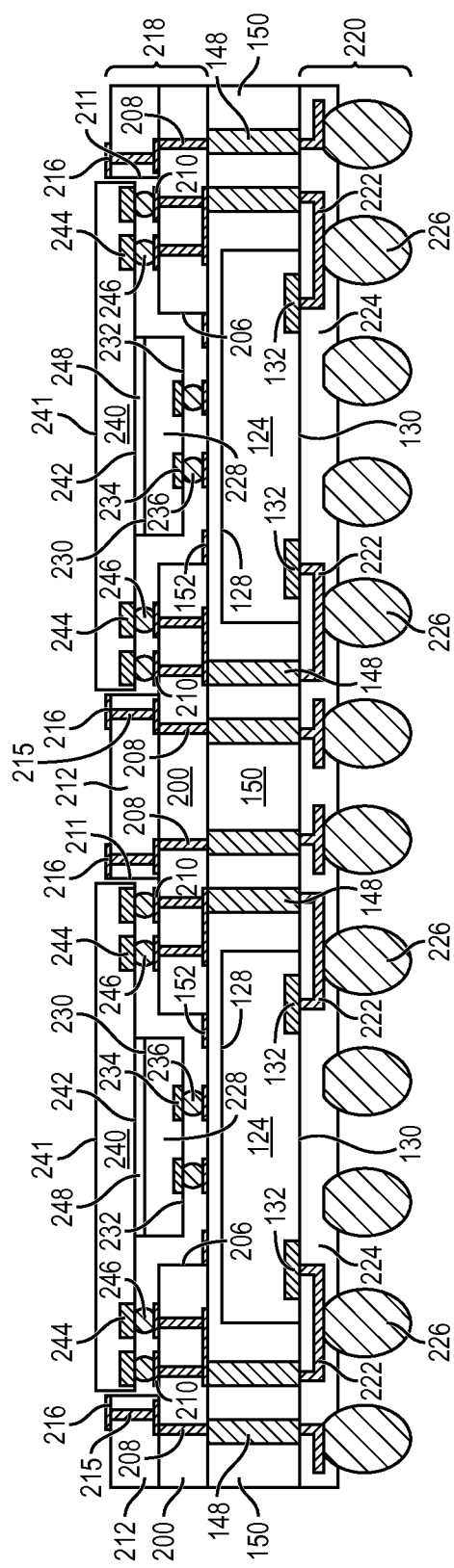

In FIG. 6j, semiconductor die 240 has a back surface 241 and an active surface 242 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 242 to implement analog circuits or digital circuits, such as DSP, ASIC, memory, or other signal processing circuit. Semiconductor die 240 may also contain IPDs, such as inductors, capacitors, and resistors, for RF signal processing. In one embodiment, semiconductor die 240 is a flipchip type semiconductor die. Contact pads 244 are formed over active surface 242 and electrically connected to the circuits on the active surface. Bumps 246 are formed over contact pads 244. Semiconductor die 240 is mounted to back surface 230 of semiconductor die 228 using a b-stage backside coating 248. Bumps 246 are electrically connected to conductive layer 210 of the first stepped interconnect layer 218.

Figure 6K:
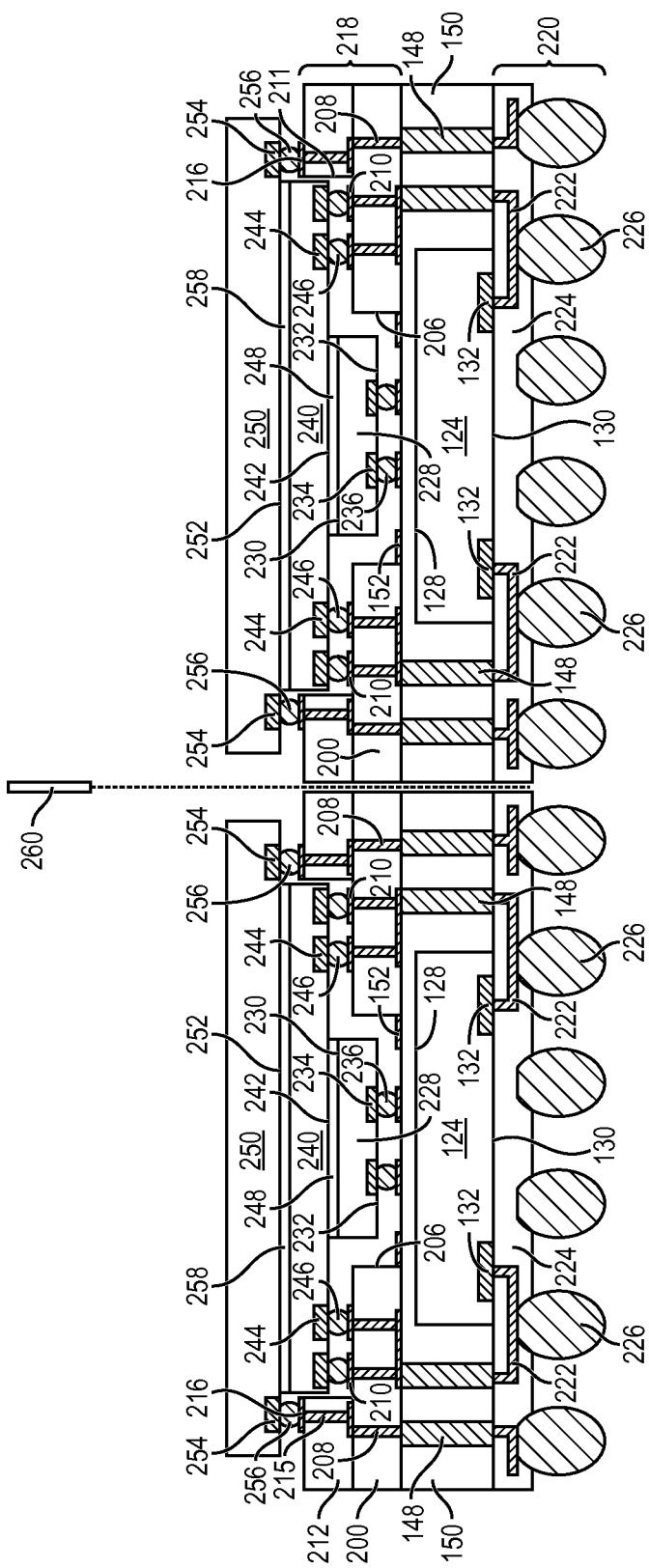

In FIG. 6k, semiconductor die 250 has an active surface 252 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 252 to implement analog circuits or digital circuits, such as DSP, ASIC, memory, or other signal processing circuit. Semiconductor die 250 may also contain IPDs, such as inductors, capacitors, and resistors, for RF signal processing. In one embodiment, semiconductor die 250 is a flipchip type semiconductor die. Contact pads 254 are formed over active surface 252 and electrically connected to the circuits on the active surface. Bumps 256 are formed over contact pads 254. Semiconductor die 250 is mounted to back surface 241 of semiconductor die 240 using a b-stage backside coating 258. Bumps 256 are electrically connected to conductive layer 216 of the second stepped interconnect layer 218.

Semiconductor die 124, 228, 240, and 250 are singulated through insulating layers 200 and 212, encapsulant 150, and build-up interconnect structure 220 with saw blade or laser cutting tool 260 into individual Fo-WLCSP 262. In another embodiment, the singulation of stepped interconnect layer 218, encapsulant 150, and build-up interconnect structure 220 occurs prior to mounting semiconductor die 228, 240, and 250, i.e., after FIG. 6h. Semiconductor die 228, 240, and 250 are mounted after singulation.

Figure 7:
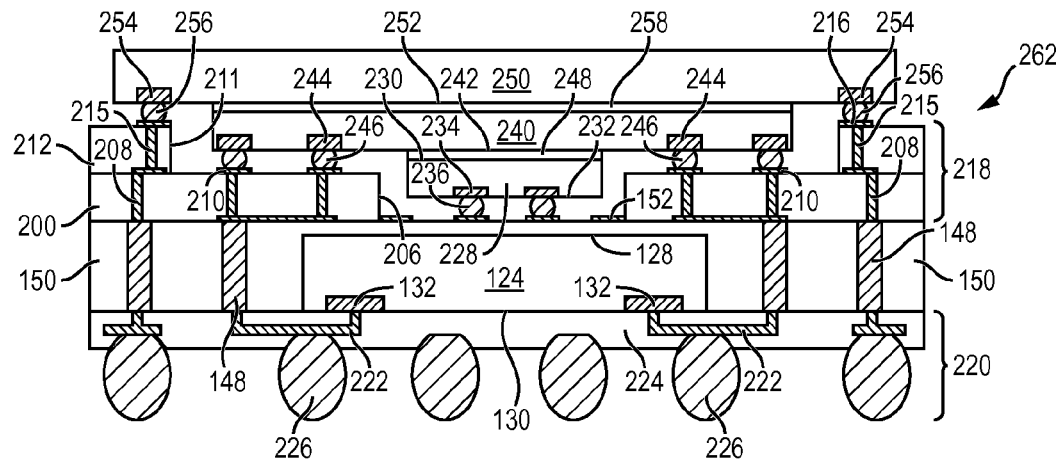
FIG. 7 illustrates a Fo-WLCSP with the multiple stepped interconnect layer electrically connecting the stacked semiconductor die.

FIG. 7 shows Fo-WLCSP 262 after singulation. Semiconductor die 124 is electrically connected through contact pads 132 and build-up interconnect structure 220 to conductive pillars 148, conductive layer 152, and multi-stepped interconnect layers 218. Semiconductor die 228 is partially disposed within opening 202 of the first stepped interconnect layer 218 to reduce the thickness of Fo-WLCSP 262. Semiconductor die 228 is electrically connected to conductive layer 152, conductive pillars 148, multi-stepped interconnect layers 218, and build-up interconnect structure 220. Semiconductor die 240 is partially disposed within opening 214 of the second stepped interconnect layer 218 to reduce the thickness of Fo-WLCSP 262. Semiconductor die 240 is electrically connected to conductive layer 152, conductive pillars 148, multi-stepped interconnect layers 218, and build-up interconnect structure 220. Semiconductor die 250 is mounted over semiconductor die 240 and electrically connected to conductive layer 152, conductive pillars 148, multi-stepped interconnect layers 218, and build-up interconnect structure 220. With semiconductor die 228 and 240 at least partially disposed within openings 202 and 214 of multi-stepped interconnect layers 218, bumps 236, 246, and 256 can be made small for a fine interconnect pitch. The small size and fine pitch of bumps 236, 246, and 256 increases I/O count and reduces bump collapse. Additional stepped layers can be formed in multi-stepped interconnect structure 218, as described in FIGS. 6a-6k, to accommodate more stacked semiconductor die.

Figure 8:
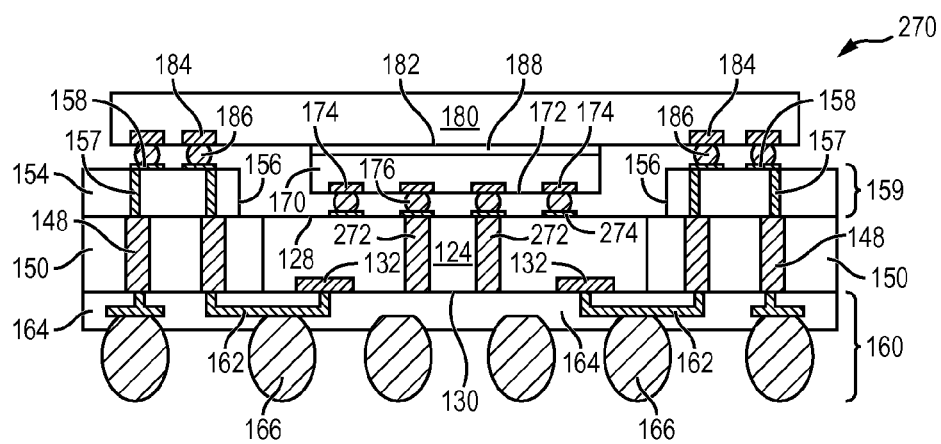
FIG. 8 illustrates conductive TSV formed through the bottom semiconductor die.

FIG. 8 shows an embodiment of Fo-WLCSP 270, similar to FIG. 5, with conductive TSV formed through an RDL formed over semiconductor die 124. A plurality of vias is formed in semiconductor die 124 while in wafer form, see FIGS. 3a-3c, using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 272. The height of conductive pillars 148 is substantially the same as the thickness of semiconductor die 124 so back surface 128 is devoid of encapsulant 150. RDL 274 is formed on back surface 128 of semiconductor die 124. RDL 274 is electrically connected to conductive vias 157 and conductive layer 158 of stepped interconnect layer 159, and further to conductive pillars 148 and build-up interconnect structure 160. Conductive TSV 272 provide z-direction vertical electrical interconnect for semiconductor die 124 to RDL 274 and build-up interconnect structure 160.

Figure 9:
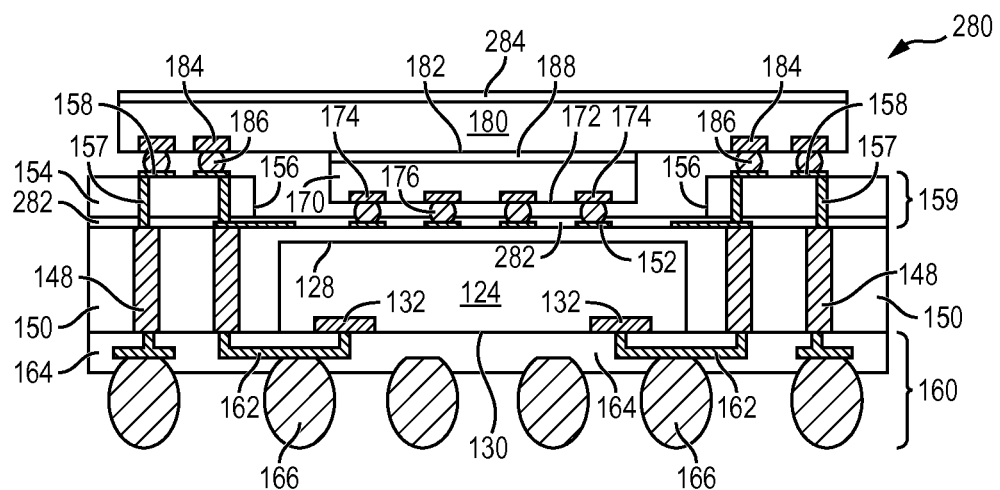
FIG. 9 illustrates a photoresist layer formed over the encapsulant.

FIG. 9 shows an embodiment of Fo-WLCSP 280, similar to FIG. 5, with an insulative or solder resist layer 282 formed over encapsulant 150 and conductive layer 152 prior to forming the stepped interconnect layer 159. The insulating layer 282 reduces stress on back surface 128 of semiconductor die 124. A portion of insulating layer 282 is removed by an etching process to expose conductive layer 152 for connection of bumps 176 of semiconductor die 170. An insulative or solder resist layer 284 can also be formed over the back surface of semiconductor die 170 to reduce stress on the back surface.

Figure 10:
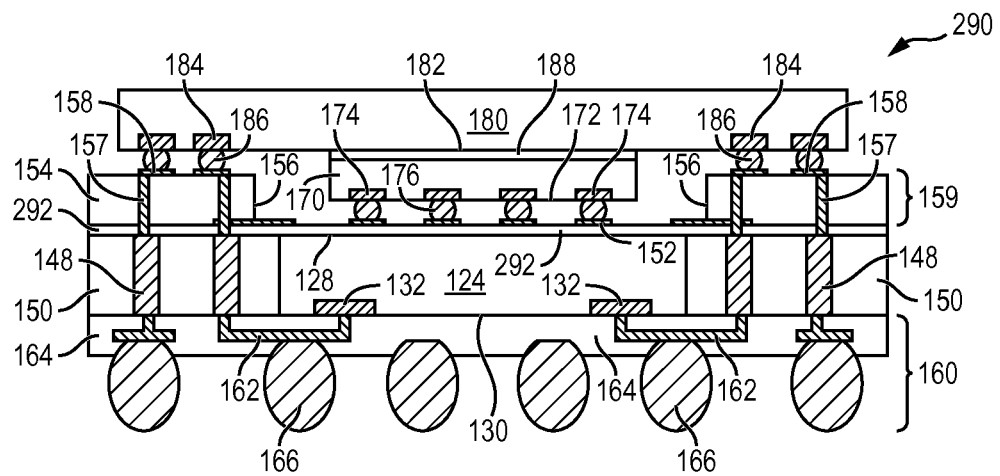
FIG. 10 illustrates an insulating layer formed over the bottom semiconductor die and encapsulant.

FIG. 10 shows an embodiment of Fo-WLCSP 290, similar to FIG. 5, with the height of conductive pillars 148 substantially the same as the thickness of semiconductor die 124 so back surface 128 is devoid of encapsulant 150. An insulative or passivation layer 292 is formed over back surface 128 and encapsulant 150 prior to forming the stepped interconnect layer 159. The insulating layer 292 is formed using PVD, CVD, printing, spin coating, spray coating, sintering or thermal oxidation. The insulating layer 292 contains one or more layers of SiO2, Si3N4, SiON, Ta2O5, Al2O3, or other material having similar insulating and structural properties. Conductive layer 152 is formed over insulating layer 292.

Figure 11:
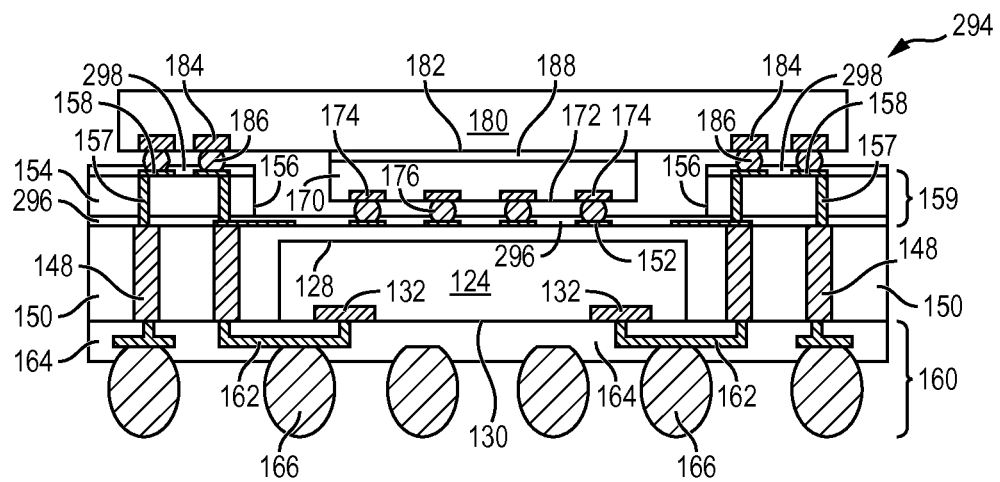
FIG. 11 illustrates photoresist layers formed over the bottom semiconductor die and stepped interconnect layer.

FIG. 11 shows an embodiment of Fo-WLCSP 294, similar to FIG. 5, with an insulative or solder resist layer 296 formed over encapsulant 150 and conductive layer 152 prior to forming the stepped interconnect layer 159. The insulating layer 296 reduces stress on back surface 128 of semiconductor die 124. A portion of insulating layer 296 is removed by an etching process to expose conductive layer 152 for connection of bumps 176 of semiconductor die 170. An insulative or solder resist layer 298 can also be formed over insulating layer 154 and conductive layer 158 of stepped interconnect layer 159 prior to mounting semiconductor die 180. A portion of insulating layer 298 is removed by an etching process to expose conductive layer 158 for connection of bumps 186 of semiconductor die 180.

Figure 12:
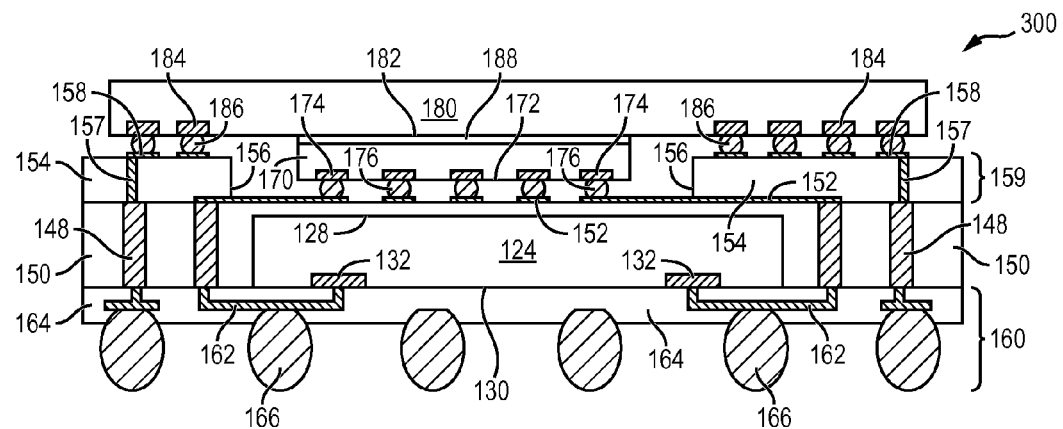
FIG. 12 illustrates the opening of the stepped interconnect layer offset with respect to a central area of the Fo-WLCSP.

FIG. 12 shows an embodiment of Fo-WLCSP 300, similar to FIG. 5, with opening 155 in insulating layer 154 offset with respect to a central area of semiconductor die 124.

Accordingly, semiconductor die 170 is offset with respect to a center of Fo-WLCSP 300 and more bumps 186 are formed on one side of semiconductor die 180, respectively, than the other side of the semiconductor die.

Figure 13:
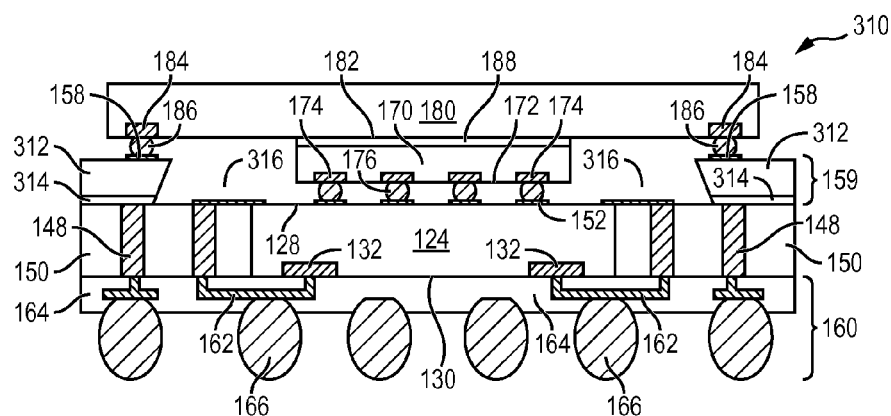
FIG. 13 illustrates a substrate mounted over the encapsulant and electrically connected to the stacked semiconductor die.

FIG. 13 shows an embodiment of Fo-WLCSP 310, similar to FIG. 5, with the height of conductive pillars 148 substantially the same as the thickness of semiconductor die 124 so back surface 128 is devoid of encapsulant 150. Conductive layer 152 is formed over back surface 128 or an insulating layer, similar to FIG. 10. A substrate 312 is mounted over encapsulant 150 and conductive pillars 148 with a conductive adhesive 314. Alternatively, substrate 312 can be secured to conductive pillars 148 with micro-bumps. Substrate 312 can be a leadframe, laminate substrate, or silicon substrate with an opening or recess 316 to contain a portion of semiconductor die 170. Substrate 312 operates as the stepped interconnect layer. Substrate 312 is electrically connected to conductive pillars 148. Bumps 186 of semiconductor die 180 are electrically connected to substrate 312.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first semiconductor die;
    depositing an encapsulant around the first semiconductor die;
    forming a first stepped interconnect structure over a surface of the encapsulant by,
        (a) forming an insulating layer, and
        (b) forming a conductive via through the insulating layer; and
    forming an opening in the insulating layer of the first stepped interconnect structure, wherein the opening extends through the insulating layer over the first semiconductor die.

2. The method of claim 1, further including disposing a second semiconductor die in the opening of the first stepped interconnect structure.

3. The method of claim 1, further including disposing a second stepped interconnect structure over the first stepped interconnect structure.

4. The method of claim 1, further including forming a conductive pillar through the encapsulant.

5. The method of claim 1, wherein forming the first stepped interconnect structure further includes:
    providing a pre-formed interconnect substrate; and
    disposing the pre-formed interconnect substrate over the surface of the encapsulant.

6. A semiconductor device, comprising:
    a first semiconductor die;
    an encapsulant disposed around the first semiconductor die; and
    a first stepped electrical interconnect structure disposed over a surface of the encapsulant, wherein the first stepped electrical interconnect structure includes,
        (a) an insulating layer, and
        (b) a conductive via formed through the insulating layer with an opening in the insulating layer of the first stepped electrical interconnect structure, wherein the opening extends through the insulating layer to the surface of the encapsulant over the first semiconductor die.

7. The semiconductor device of claim 6, further including a second semiconductor die disposed in the opening of the insulating layer of the first stepped electrical interconnect structure.

8. The semiconductor device of claim 6, further including a second stepped electrical interconnect structure disposed over the first stepped electrical interconnect structure.

9. The semiconductor device of claim 6, further including a conductive pillar formed through the encapsulant.

10. A semiconductor device, comprising:
    a first semiconductor die;
    an encapsulant disposed around the first semiconductor die; and
    a first stepped interconnect structure disposed over the encapsulant, wherein the first stepped interconnect structure includes,
        (a) an insulating layer, and
        (b) a conductive via formed through the insulating layer with an opening formed in the insulating layer of the first stepped interconnect structure, wherein the opening extends through the insulating layer over the first semiconductor die.

11. The semiconductor device of claim 10, further including a conductive pillar formed through the encapsulant.

12. The semiconductor device of claim 10, further including a second stepped interconnect structure disposed over the first stepped interconnect structure.

13. The semiconductor device of claim 10, further including a second semiconductor die disposed in the opening of the insulating layer of the first stepped interconnect structure.

14. The semiconductor device of claim 13, further including a third semiconductor die disposed over the first stepped interconnect structure and second semiconductor die.

15. The semiconductor device of claim 10, wherein the first stepped interconnect structure includes a pre-formed interconnect substrate disposed over the encapsulant.

16. The semiconductor device of claim 6, wherein the first stepped electrical interconnect structure includes a pre-formed interconnect substrate disposed over the encapsulant.

17. The semiconductor device of claim 7, further including a third semiconductor die disposed over the first stepped electrical interconnect structure and second semiconductor die.

18. A semiconductor device, comprising:
    a first semiconductor die;
    an encapsulant deposited around the first semiconductor die; and
    a first interconnect structure formed over a surface of the encapsulant, wherein the first interconnect structure includes,
        (a) an insulating layer, and
        (b) a conductive via formed through the insulating layer with an opening in the insulating layer of the first interconnect structure, wherein the opening extends through the insulating layer to the surface of the encapsulant.

19. The semiconductor device of claim 18, further including a second semiconductor die disposed in the opening of the first interconnect structure.

20. The semiconductor device of claim 19, further including a third semiconductor die disposed over the first interconnect structure and second semiconductor die.

21. The semiconductor device of claim 18, further including a second interconnect structure disposed over the first interconnect structure.

22. The semiconductor device of claim 18, further including a conductive pillar formed through the encapsulant.

23. The semiconductor device of claim 18, wherein the first interconnect structure includes a pre-formed interconnect substrate disposed over the surface of the encapsulant.

* * * * *